US012674847B2

(12) United States Patent
Chan et al.

(10) Patent No.: US 12,674,847 B2
(45) Date of Patent: Jul. 7, 2026

(54) METHOD AND APPARATUS OF PERFORMING FAILURE DETECTION ON AC INPUT VOLTAGE, AND POWER SUPPLY SYSTEM

(71) Applicant: Murata Manufacturing Co., Ltd., Nagaokakyo (JP)

(72) Inventors: Chukhung Chan, Hong Kong (CN); Chuipong Liu, Hong Kong (CN); Kwokwai Lo, Hong Kong (CN)

(73) Assignee: MURATA MANUFACTURING CO., LTD., Kyoto (JP)

( * ) Notice: Subject to any disclaimer, the term of this patent is extended or adjusted under 35 U.S.C. 154(b) by 182 days.

(21) Appl. No.: 18/804,511

(22) Filed: Aug. 14, 2024

(65) Prior Publication Data

US 2025/0067814 A1 Feb. 27, 2025

(30) Foreign Application Priority Data

Aug. 21, 2023 (CN) ......................... 202311057161.X

(51) Int. Cl.
| | |
|---|---|
| G01R 19/165 | (2006.01) |
| G01R 19/12 | (2006.01) |
| G01R 31/42 | (2006.01) |

(52) U.S. Cl.
CPC ............. G01R 31/42 (2013.01); G01R 19/12 (2013.01); G01R 19/16547 (2013.01)

(58) Field of Classification Search
CPC ... G01R 19/12; G01R 19/16547; G01R 31/42
See application file for complete search history.

(56) References Cited

U.S. PATENT DOCUMENTS

2014/0119084 A1* 5/2014 Ashikaga ................ H02M 1/32
363/126
2020/0014239 A1 1/2020 Liu

FOREIGN PATENT DOCUMENTS

| | | |
|---|---|---|
| CN | 113137989 A | 7/2021 |
| JP | H10117484 A | 5/1998 |

* cited by examiner

*Primary Examiner* — Alesa Allgood
(74) *Attorney, Agent, or Firm* — KEATING & BENNETT, LLP

(57) ABSTRACT

A method of performing a failure detection on an AC input voltage includes comparing the AC input voltage with first and second reference voltages, determining that the AC input voltage is normal, if an absolute value of the AC input voltage is greater than the first reference voltage, determining that the AC input voltage has failed, if a duration of the absolute value of the AC input voltage being less than the second reference voltage is greater than a threshold duration, and determining that the AC input voltage has failed, if the absolute value of the AC input voltage is not less than the second reference voltage and not greater than the first reference voltage, and a duration of an absolute value of a change rate of the AC input voltage being less than a voltage change rate threshold is greater than a predetermined time delay.

20 Claims, 4 Drawing Sheets

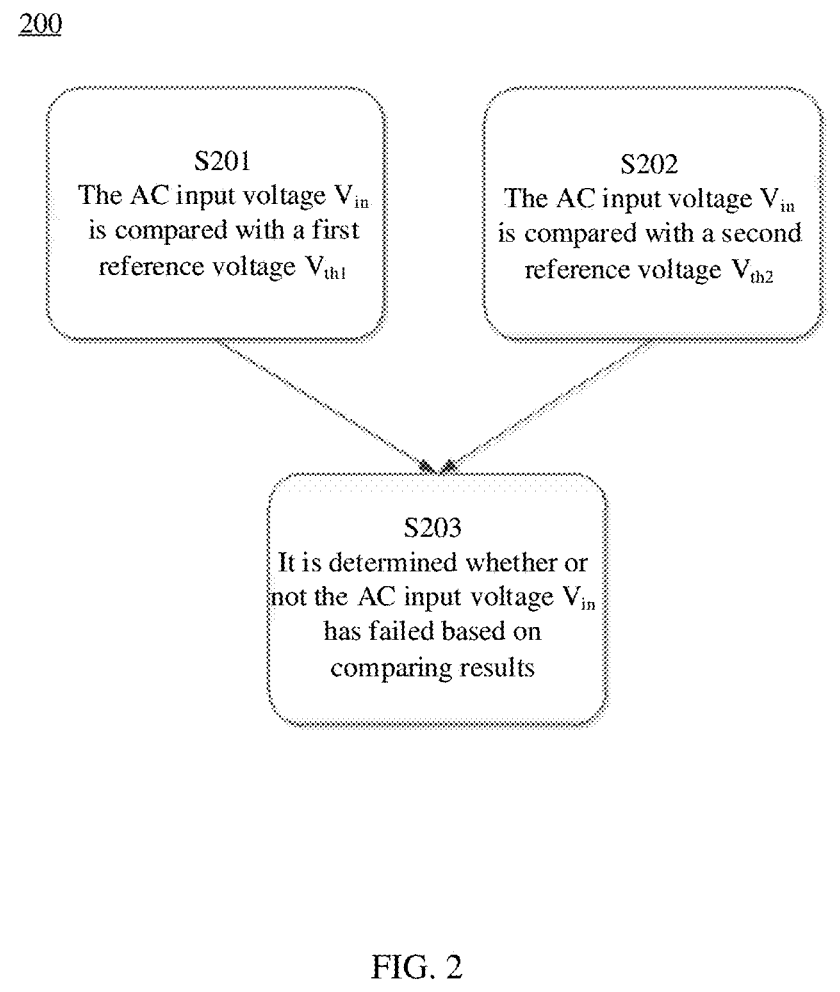

200

S201
The AC input voltage $V_{in}$ is compared with a first reference voltage $V_{th1}$ S202
The AC input voltage $V_{in}$ is compared with a second reference voltage $V_{th2}$ S203
It is determined whether or not the AC input voltage $V_{in}$ has failed based on comparing results

FIG. 2

METHOD AND APPARATUS OF PERFORMING FAILURE DETECTION ON AC INPUT VOLTAGE, AND POWER SUPPLY SYSTEM

CROSS REFERENCE TO RELATED APPLICATIONS

This application claims the benefit of priority to Chinese Patent Application No. 202311057161.X filed on Aug. 21, 2023. The entire contents of this application are hereby incorporated herein by reference.

BACKGROUND OF THE INVENTION

1. Field of the Invention

The present disclosure relates to power supply failure detection technologies, and in particular, to methods of performing failure detection on an alternating current (AC) input voltage, apparatuses to perform failure detection on an AC input voltage, and power supply systems.

2. Description of the Related Art

A power supply converter usually uses a sinusoidal AC input source as an input power supply, and an input voltage failure detection is critical in alerting a user that a system is powered off to take necessary actions. For a power supply system including an automatic transfer switch (ATS) input, two AC power supplies are connected to a power supply converter. When a main input source fails, the ATS may rapidly switch the input of the power supply converter to the other power supply before shutdown of the power supply converter. These functions need to be achieved through a rapid failure detection of the AC voltage.

SUMMARY OF THE INVENTION

Example embodiments of the present invention provide methods of performing failure detection on an alternating current (AC) input voltage, apparatuses to perform failure detection on an AC input voltage, and power supply systems.

According to a first example embodiment of the present disclosure, a method of performing failure detection on an AC input voltage includes comparing the AC input voltage with a first reference voltage, comparing the AC input voltage with a second reference voltage, the second reference voltage being less than the first reference voltage, and determining whether or not the AC input voltage has failed based on comparing results. The determining whether or not the AC input voltage has failed based on comparing results includes determining that the AC input voltage is normal, in response to an absolute value of the AC input voltage being greater than the first reference voltage, determining that the AC input voltage has failed, in response to a duration in which the absolute value of the AC input voltage is less than the second reference voltage being greater than a threshold duration, and determining that the AC input voltage has failed, in response to the absolute value of the AC input voltage being greater than or equal to the second reference voltage and less than or equal to the first reference voltage, and a duration in which an absolute value of a change rate of the AC input voltage is less than a voltage change rate threshold being greater than a predetermined time delay.

In some example embodiments, the threshold duration is set to a sum of a duration in which the absolute value of the AC input voltage is less than the second reference voltage under a normal condition and a duration margin.

In some example embodiments, the duration margin is determined according to a maximum allowable time delay of reporting that the AC input voltage has failed.

In some example embodiments, the voltage change rate threshold is set to a difference of a minimum voltage change rate of the AC input voltage under a normal condition and an input voltage change rate margin.

In some example embodiments, the input voltage change rate margin is determined according to a difference between a waveform of the AC input voltage under the normal condition and a pure sinusoidal waveform.

In some example embodiments, the minimum voltage change rate is a voltage change rate of the AC input voltage at the first reference voltage when the AC input voltage rises from the second reference voltage to the first reference voltage under the normal condition.

In some example embodiments, a waveform of the AC input voltage is a sinusoidal waveform.

According to a second example embodiment of the present disclosure, a detection apparatus of performing failure detection on an alternating current (AC) input voltage is provided, including one or more processors, and one or more memories including computer-executable instructions thereon, where the computer-executable instructions, when executed by the one or more processors, are configured to cause the one or more processors to implement any method described above.

According to a third example embodiment of the present disclosure, a power supply system is provided, including a first alternating current (AC) input power supply, a second alternating current (AC) input power supply, a power supply converter connected to the first AC input power supply and the second AC input power supply, and the detection apparatus according to the second example embodiment of the present disclosure, where the power supply converter is configured to switch the first AC input power supply to the second AC input power supply in response to the detection apparatus detecting that the first AC input power supply has failed.

The above and other elements, features, steps, characteristics and advantages of the present invention will become more apparent from the following detailed description of the example embodiments with reference to the attached drawings.

BRIEF DESCRIPTION OF THE DRAWINGS

FIG. 2 shows a schematic flowchart of a method of performing failure detection on an alternating current (AC) input voltage according to example embodiments of the present invention.

DETAILED DESCRIPTION OF THE EXAMPLE EMBODIMENTS

According to the following detailed description of example embodiments of the present disclosure in conjunction with accompanying drawings, other aspects, advantages, and prominent features of the present disclosure will become clear to those skilled in the art.

In the present disclosure, the terms "including" and "containing" and their derivatives are meant to include rather than limit, and the term "or" is inclusive and means "and/ or".

In the present disclosure, the following example embodiments used to describe the principles of the present disclosure are just illustrative and should not be construed in any way as limiting the scope of the present disclosure. The following detailed description with reference to the accompanying drawings helps provide an understanding of the example embodiments of the present disclosure defined by the claims and their equivalents. The following detailed description includes a variety of specific details to facilitate understanding, but these details should be considered illustrative only. Therefore, those skilled in the art should be aware that various changes and modifications may be made to example embodiments described herein without departing from the scope and spirit of the present disclosure. In addition, for the sake of clarity and conciseness, descriptions of well-known functions and structures have been omitted. In addition, throughout the accompanying drawings, the same reference signs are used for similar functions and operations.

The present disclosure provides methods of performing rapid failure detection on an AC voltage by comparing an input voltage with absolute thresholds and comparing a voltage change rate with a minimum change rate threshold.

Figure 1:
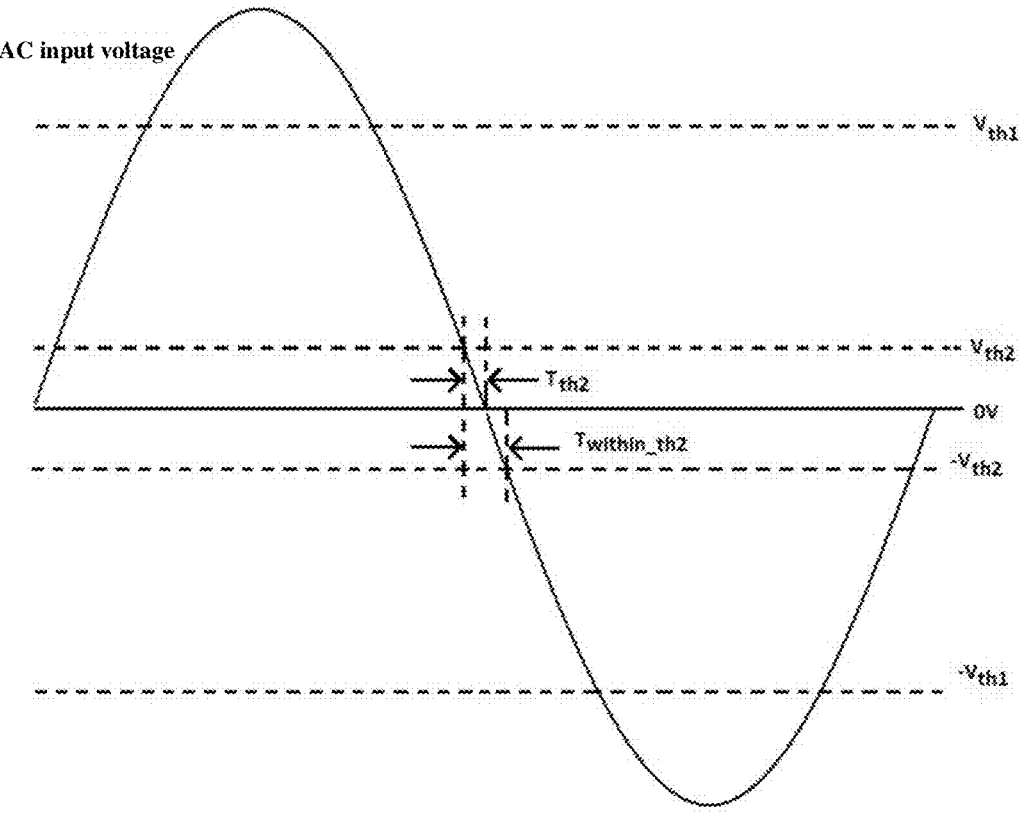
FIG. 1 shows a waveform diagram of a sinusoidal alternating current (AC) input voltage under a normal condition.

FIG. 1 shows a waveform diagram of a sinusoidal alternating current (AC) input voltage under a normal condition.

As shown in FIG. 1, taking a sinusoidal wave as an example, a voltage value of the AC input voltage under the normal condition may be given by the equation shown below:

$$V_{in} = V_{pk}\sin(2\pi Ft)$$

where $V_{in}$ represents a sinusoidal AC input voltage value, $V_{pk}$ represents a sinusoidal AC input peak voltage, F represents a sinusoidal AC input frequency, and t represents time.

FIG. 2 shows a schematic flowchart of a method 200 of performing failure detection on an AC input voltage according to example embodiments of the present disclosure.

As shown in FIG. 2, the method 200 of performing failure detection on the AC input voltage according to example embodiments of the present disclosure may include the steps S201 to S203.

In step S201, the AC input voltage $V_{in}$ is compared with a first reference voltage $V_{th1}$.

In step S202, the AC input voltage $V_{in}$ is compared with a second reference voltage $V_{th2}$.

In step S203, it is determined whether or not the AC input voltage $V_{in}$ has failed based on comparing results.

The first reference voltage $V_{th1}$ is a minimum voltage that is sufficient to maintain a continuous operation of a power supply. The second reference voltage $V_{th2}$ is a voltage level at which the power supply fails to draw enough power from the input and its output power is maintained by an internal storage capacitor only.

Figure 3:
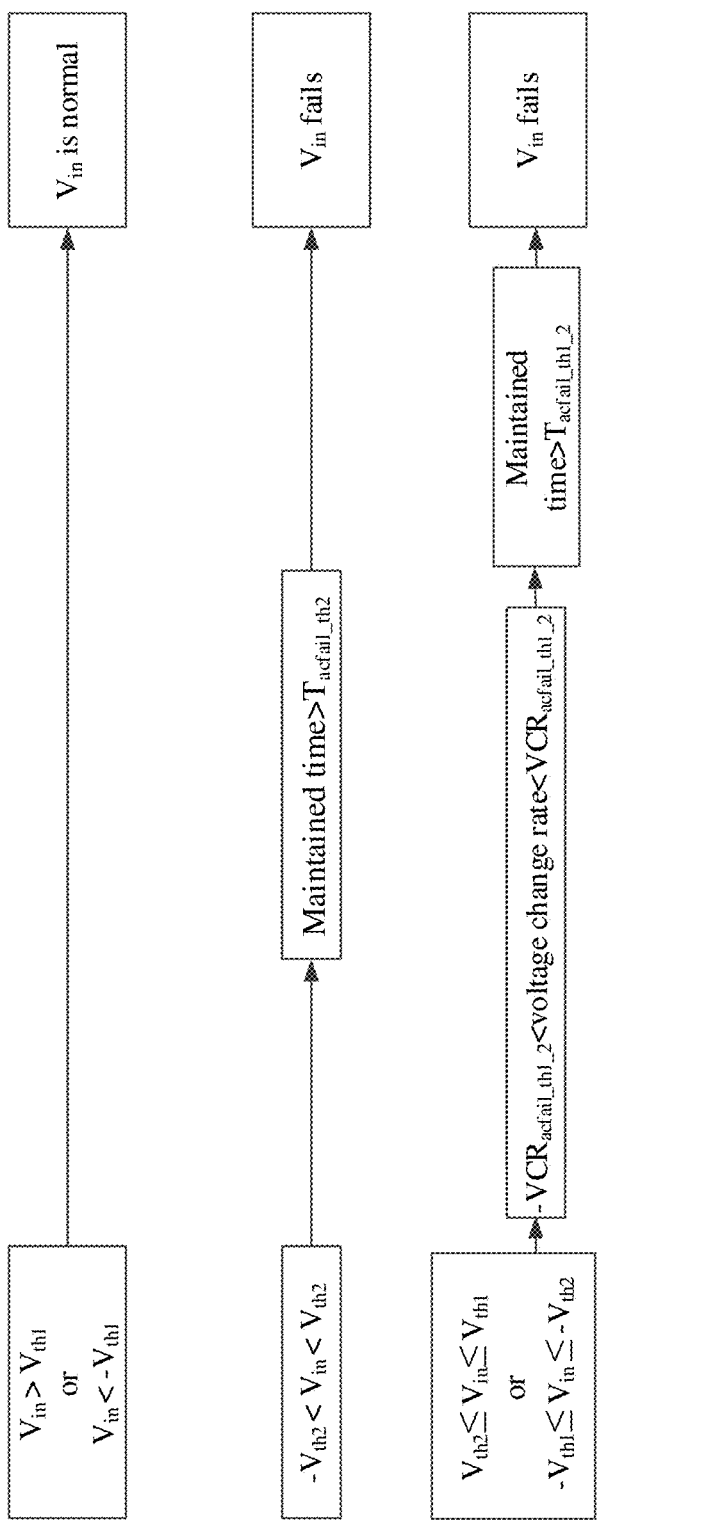
FIG. 3 shows a flowchart of a specific implementation of a method of performing failure detection on an alternating current (AC) input voltage according to example embodiments of the present invention.

FIG. 3 shows a flowchart of a specific implementation of a method of performing failure detection on an AC input voltage according to example embodiments of the present disclosure.

When an absolute value of the AC input voltage $V_{in}$ is greater than the first reference voltage $V_{th1}$, i.e., $V_{in} > V_{th1}$ or $V_{in} < -V_{th1}$, it may be determined that the AC input voltage is sufficient to maintain a continuous operation of the power supply, so the AC input voltage $V_{in}$ is determined to be normal.

When the absolute value of the AC input voltage $V_{in}$ is less than the second reference voltage $V_{th2}$, i.e., $-V_{th2} < V_{in} < V_{th2}$, since the power supply fails to draw enough power from the input and its output power is maintained by the internal storage capacitor only, the power supply may not operate for a long time. Therefore, if the AC input voltage $V_{in}$ stays in a range of $-V_{th2} < V_{in} < V_{th2}$ for longer than a threshold duration $T_{acfail\_th2}$, it may be determined that the AC input voltage $V_{in}$ has failed. The threshold duration $T_{acfail\_th2}$ may be determined according to the method described below.

A time length of the AC input voltage $V_{in}$ rising from 0 V to $V_{th2}$ is $T_{th2}$ (referring to FIG. 1), which may be derived from the equation shown below:

$$T_{th2} = \frac{1}{2\pi F}\sin^{-1}\left(\frac{V_{th2}}{V_{pk}}\right)$$

Therefore, a duration in which the AC input voltage $V_{in}$ stays in the range of $-V_{th2} < V_{in} < V_{th2}$ under the normal condition is:

$$T_{within\_th2} = 2 \times T_{th2} = \frac{1}{\pi F}\sin^{-1}\left(\frac{V_{th2}}{V_{pk}}\right)$$

In order to detect a failure of the AC input voltage by $V_{th2}$, it may be regarded that the power supply may operate at a minimum input RMS (root mean square) voltage. A peak voltage of the minimum input RMS voltage is $V_{pk\_min}$. If the AC input voltage has a minimum AC frequency $F_{min}$ under the normal condition, $T_{within\_th2}$ is the longest at the minimum AC frequency $F_{min}$.

In order to have a certain design margin and avoid erroneously triggering a determination of a failure of the AC input voltage, a duration margin $\Delta T$ may be added to $T_{within\_th2}$ to obtain $T_{acfail\_th2}$. It is possible to measure a duration in which the absolute value of the AC input voltage is less than $V_{th2}$. If the duration is longer than $T_{acfail\_th2}$, it is determined that the AC input voltage has failed. $T_{acfail\_th2}$ may be derived from the equation shown below:

$$T_{acfail\_th2} = \frac{1}{\pi F_{min}}\sin^{-1}\left(\frac{V_{th2}}{V_{pk\_min}}\right) + \Delta T$$

where the duration margin $\Delta T$ may be determined according to a maximum allowable time delay of reporting a failure of the AC input voltage when the AC input voltage falls to 0 V. If it is required to report a failure of the AC input voltage before a shutdown of the power supply, the duration margin $\Delta T$ may be determined according to a duration in which the power output is maintained after the AC input voltage falls to 0 V (i.e., a duration in which an output power of the power supply is maintained by the internal storage capacitor).

When the absolute value of the AC input voltage $V_{in}$ is greater than or equal to the second reference voltage $V_{th2}$ and less than or equal to the first reference voltage $V_{th1}$, i.e., $V_{th2} \leq V_{in} \leq V_{th1}$ or $-V_{th1} \leq V_{in} \leq -V_{th2}$, the sinusoidal AC input voltage may have a relatively high voltage change rate under the normal condition. The voltage change rate may be derived from the equation shown below:

$$\frac{dVin}{dt} = 2\pi F \times Vpk \cos(2\pi Ft)$$

If a rising rate or falling rate of the input voltage is too slow, then it is determined that the AC input voltage $V_{in}$ has failed. The change rate of the input voltage may be the minimum at the minimum input RMS voltage and the minimum AC frequency. When the AC input voltage $V_{in}$ rises from $V_{th2}$ to $V_{th1}$, the minimum voltage change rate may be at a point where the voltage is $V_{th1}$. The minimum voltage change rate may be derived from the equation shown below:

$$VCR_{min\_th1\_2} = 2\pi F_{min} \times V_{pk\_min} \cos(2\pi F_{min} T_{th1})$$

where, $$T_{th1} = \frac{1}{2\pi F_{min}} \sin^{-1}\left(\frac{V_{th1}}{V_{pk\_min}}\right)$$

When the AC input voltage $V_{in}$ falls from $-V_{th2}$ to $-V_{th1}$, the voltage change rate is negative, and the maximum voltage change rate may be at a point where the voltage is $-V_{th1}$. The maximum voltage change rate may be derived from the equation shown below:

$$-VCR_{min\_th1\_2} = -(2\pi F_{min} \times V_{pk\_min} \cos(2\pi F_{min} T_{th1}))$$

Therefore, when the AC input voltage $V_{in}$ is in the range of $V_{th2} \leq V_{in} \leq V_{th1}$ or $-V_{th1} \leq V_{in} \leq -V_{th2}$, the change rate of the input voltage may not stay in a range of $+/-VCR_{min\_th1\_2}$. Otherwise, it may be determined that the AC input voltage $V_{in}$ has failed.

In order to have a certain design margin and avoid erroneously triggering a determination of a failure of the AC input voltage, it is possible to subtract a voltage change rate margin $\Delta VCR$ when determining the voltage change rate threshold $VCR_{acfail\_th1\_2}$. Therefore, the voltage change rate threshold $VCR_{acfail\_th1\_2}$ may be derived from the equation shown below:

$$VCR_{acfail\_th1\_2} = VCR_{min\_th1\_2} - \Delta VCR$$

It should be noted that the waveform of the AC input voltage $V_{in}$ is not necessarily a sinusoidal wave, but may also be other waveforms (e.g., square wave, etc.), and the sinusoidal wave is just taken as an example. Therefore, here, the voltage change rate margin $\Delta VCR$ is determined according to a difference between the waveform of the AC input voltage $V_{in}$ under the normal condition and a pure sinusoidal waveform (crest factor=1.414). In some cases, the power supply operates with the crest factor of the input voltage being in a range from 1.1 to 1.6. An input with a different voltage waveform may be used to examine the operation of the power supply, and a high voltage change rate margin $\Delta VCR$ may be used.

When the AC input voltage $V_{in}$ includes some short spikes, sags, or noises that do not affect the operation of the power supply converter, in order to avoid erroneously triggering a determination of a failure of the AC input voltage, a predefined time delay $T_{acfail\_th1\_2}$ may be provided to determine whether or not the AC input voltage $V_{in}$ has failed. Like the $\Delta T$ mentioned before, $T_{acfail\_th1\_2}$ may be defined according to the maximum allowable time delay of reporting a failure of the AC input voltage and the output maintained duration of the power supply.

For a negative AC voltage cycle, the consideration of the voltage change rate is the same but only the input voltage is inverted.

Therefore, when $V_{th2} \leq V_{in} \leq V_{th1}$ or $-V_{th1} \leq V_{in} \leq -V_{th2}$, if the absolute value of the voltage change rate of the AC input voltage $V_{in}$ stays in a range of less than the voltage change rate threshold $VCR_{acfail\_th1\_2}$, i.e., $$-VCR_{acfail\_th1\_2} < \frac{dV_{in}}{dt} < VCR_{acfail\_th1\_2}$$

for longer than the predetermined time delay $T_{acfail\_th1\_2}$, then it may be determined that the AC input voltage $V_{in}$ has failed.

Figure 4:
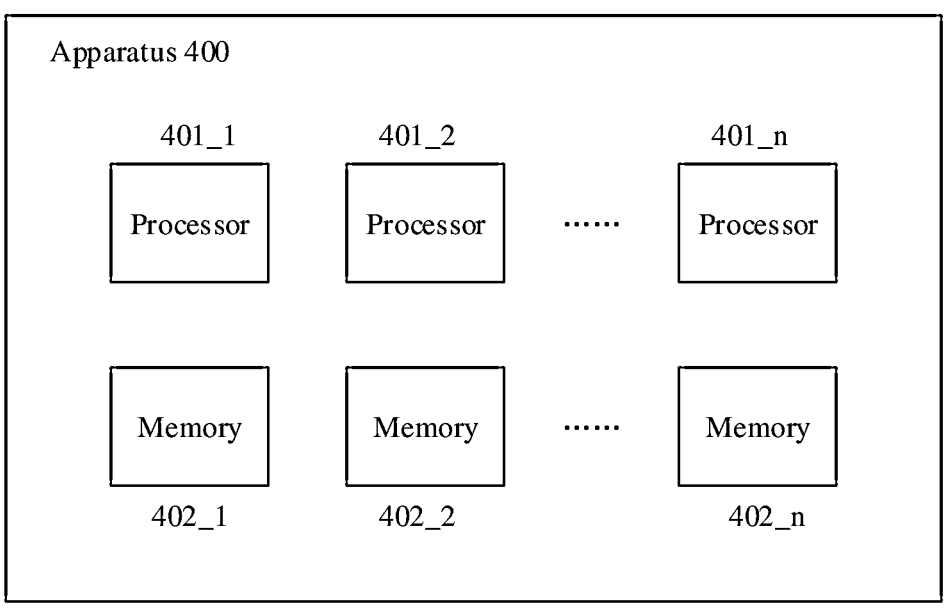
FIG. 4 shows a schematic block diagram of an apparatus of performing failure detection on an alternating current (AC) input voltage according to example embodiments of the present invention.

FIG. 4 shows a schematic block diagram of an apparatus 400 of performing failure detection on an AC input voltage according to example embodiments of the present disclosure. The apparatus shown in FIG. 4 may be any apparatus including processing capabilities. It should be noted that the apparatus shown in FIG. 4 is just an example and should not impose any limitations on the functionality and scope of use of example embodiments of the present disclosure.

As shown in FIG. 4, the apparatus 400 according to example embodiments includes one or more processors 401_1, 401_2, . . . , 401_n and one or more memories 402_1, 402_2, . . . , 402_n. The processes or methods described above with reference to the flowcharts may be implemented as computer-executable instructions. The processor may perform the above-mentioned methods defined by example embodiments of the present application according to the computer-executable instructions stored in the memory/memories.

The computer-executable instructions used to implement example embodiments of the present disclosure may be recorded on a non-transitory computer-readable storage medium. Corresponding functions may be achieved by causing a computer system to read the computer-executable instructions on the computer storage medium and to execute these instructions. The so-called "computer system" herein may be a computer system embedded in the apparatus, and may include an operating system or hardware (such as peripherals). The computer storage medium may include but not be limited to, for example, electrical, magnetic, optical, electromagnetic, infrared, or semiconductor systems, devices or components, or any combination thereof. More specific examples of the computer storage medium may include but not be limited to an electrical connection including one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any appropriate combination of the above. In the present disclosure, the computer storage medium may be any tangible medium that contains or stores computer-executable instructions. The instructions contained on the computer storage medium may be transmitted using any appropriate medium, including but not limited to a wireless one, an electric wire, an optical cable, or RF, or any appropriate combination thereof.

Various features or functional modules of the apparatus used in the above-mentioned example embodiments may be implemented or performed by a circuit (for example, monolithic or multi-chip integrated circuit). A circuit designed to perform the functions described in the specification may include a general purpose processor, a digital signal processor (DSP), an application specific integrated circuit (ASIC), a field programmable gate array (FPGA), or other programmable logic device, discrete gate or transistor logic, discrete hardware component, or any combination of the above-mentioned devices. The general purpose processor may be a microprocessor or any existing processor, controller, micro-controller, or state machine. The above-mentioned circuit may be a digital circuit or an analog circuit. When new integrated circuit technologies have emerged to replace existing integrated circuits due to advances in semiconductor technology, one or more example embodiments of the present disclosure may also be implemented using the new integrated circuit technologies.

Figure 5:
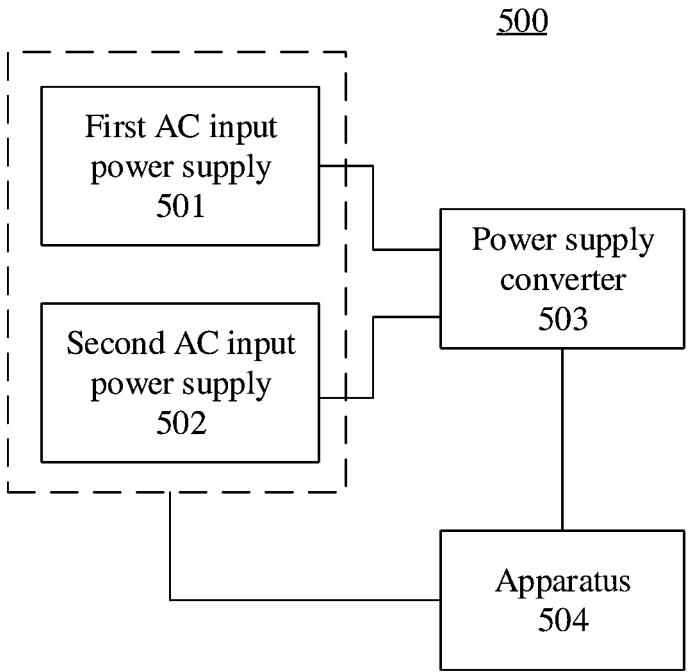
FIG. 5 shows a schematic block diagram of a power supply system including the apparatus shown in FIG. 4 according to example embodiments of the present invention.

FIG. 5 shows a schematic block diagram of a power supply system 500 including the apparatus shown in FIG. 4 according to example embodiments of the present disclosure. The system shown in FIG. 5 is just an example and should not impose any limitations on the functionality and scope of use of example embodiments of the present disclosure.

As shown in FIG. 5, the power supply system 500 according to example embodiments includes a first AC input power supply 501, a second AC input power supply 502, a power supply converter 503, and an apparatus 504 shown in FIG. 4. The power supply converter 503 is connected to the first AC input power supply 501, the second AC input power supply 502, and the apparatus 504. When the apparatus 504 detects that the first AC input power supply 504 has failed, the power supply converter 503 switches the input power supply to the second AC input power supply 502. This function can be implemented by the above-mentioned methods of performing the failure detection on the AC input voltage.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A method of performing failure detection on an alternating current (AC) input voltage, the method comprising:

comparing the AC input voltage with a first reference voltage;
comparing the AC input voltage with a second reference voltage, the second reference voltage being less than the first reference voltage; and
determining whether or not the AC input voltage has failed based on comparing results; wherein
the determining whether or not the AC input voltage has failed based on comparing results includes:
determining that the AC input voltage is normal, in response to an absolute value of the AC input voltage being greater than the first reference voltage;
determining that the AC input voltage has failed, in response to a duration in which the absolute value of the AC input voltage is less than the second reference voltage being greater than a threshold duration; and
determining that the AC input voltage has failed, in response to the absolute value of the AC input voltage being greater than or equal to the second reference voltage and less than or equal to the first reference voltage, and a duration in which an absolute value of a change rate of the AC input voltage is less than a voltage change rate threshold being greater than a predetermined time delay.

2. The method according to claim 1, wherein the threshold duration is set to a sum of a duration in which the absolute value of the AC input voltage is less than the second reference voltage under a normal condition and a duration margin.

3. The method according to claim 2, wherein the duration margin is determined according to a maximum allowable time delay of reporting that the AC input voltage has failed.

4. The method according to claim 1, wherein the voltage change rate threshold is set to a difference of a minimum voltage change rate of the AC input voltage under a normal condition and an input voltage change rate margin.

5. The method according to claim 4, wherein the input voltage change rate margin is determined according to a difference between a waveform of the AC input voltage under the normal condition and a pure sinusoidal waveform.

6. The method according to claim 5, wherein the minimum voltage change rate is a voltage change rate of the AC input voltage at the first reference voltage when the AC input voltage rises from the second reference voltage to the first reference voltage under the normal condition.

7. The method according to claim 1, wherein a waveform of the AC input voltage is a sinusoidal waveform.

8. The method according to claim 2, wherein a waveform of the AC input voltage is a sinusoidal waveform.

9. The method according to claim 3, wherein a waveform of the AC input voltage is a sinusoidal waveform.

10. The method according to claim 4, wherein a waveform of the AC input voltage is a sinusoidal waveform.

11. The method according to claim 5, wherein a waveform of the AC input voltage is a sinusoidal waveform.

12. The method according to claim 6, wherein a waveform of the AC input voltage is a sinusoidal waveform.

13. An apparatus of performing failure detection on an alternating current (AC) input voltage, the apparatus comprising:
one or more processors; and
one or more memories including computer-executable instructions thereon that, when executed by the one or more processors, are configured to cause the one or more processors to at least:
compare the AC input voltage with a first reference voltage;

compare the AC input voltage with a second reference voltage, the second reference voltage being less than the first reference voltage; and determine whether or not the AC input voltage has failed based on comparing results; wherein the computer-executable instructions are further configured to cause the one or more processors to at least:

determine that the AC input voltage is normal, in response to an absolute value of the AC input voltage being greater than the first reference voltage;

determine that the AC input voltage has failed, in response to a duration in which the absolute value of the AC input voltage is less than the second reference voltage being greater than a threshold duration; and determine that the AC input voltage has failed, in response to the absolute value of the AC input voltage being greater than or equal to the second reference voltage and less than or equal to the first reference voltage, and a duration in which an absolute value of a change rate of the AC input voltage is less than a voltage change rate threshold being greater than a predetermined time delay.

14. The apparatus according to claim 13, wherein the threshold duration is set to a sum of a duration in which the absolute value of the AC input voltage is less than the second reference voltage under a normal condition and a duration margin.

15. The apparatus according to claim 14, wherein the duration margin is determined according to a maximum allowable time delay of reporting that the AC input voltage has failed.

16. The apparatus according to claim 13, wherein the voltage change rate threshold is set to a difference of a minimum voltage change rate of the AC input voltage under a normal condition and an input voltage change rate margin.

17. The apparatus according to claim 16, wherein the input voltage change rate margin is determined according to a difference between a waveform of the AC input voltage under the normal condition and a pure sinusoidal waveform.

18. The apparatus according to claim 17, wherein the minimum voltage change rate is a voltage change rate of the AC input voltage at the first reference voltage when the AC input voltage rises from the second reference voltage to the first reference voltage under the normal condition.

19. A non-transitory computer-readable storage medium including computer-executable instructions thereon that, when executed by a processor, are configured to cause the processor to at least:

compare the AC input voltage with a first reference voltage;

compare the AC input voltage with a second reference voltage, wherein the second reference voltage is less than the first reference voltage; and determine whether or not the AC input voltage has failed based on comparing results; wherein the computer-executable instructions are further configured to cause the processor to at least:

determine that the AC input voltage is normal, in response to an absolute value of the AC input voltage being greater than the first reference voltage;

determine that the AC input voltage has failed, in response to a duration in which the absolute value of the AC input voltage is less than the second reference voltage being greater than a threshold duration; and determine that the AC input voltage has failed, in response to the absolute value of the AC input voltage being greater than or equal to the second reference voltage and less than or equal to the first reference voltage, and a duration in which an absolute value of a change rate of the AC input voltage is less than a voltage change rate threshold being greater than a predetermined time delay.

20. A power supply system comprising:

a first alternating current (AC) input power supply;

a second alternating current (AC) input power supply;

a power supply converter connected to the first AC input power supply and the second AC input power supply; and the apparatus of claim 13; wherein the power supply converter is configured to switch the first AC input power supply to the second AC input power supply in response to the apparatus detecting that the first AC input power supply has failed.

* * * * *